United States Patent [19]

Brennan et al.

[11] Patent Number: 5,171,399

[45] Date of Patent: Dec. 15, 1992

[54] REFLECTION MASS SPECTROMETRY TECHNIQUE FOR MONITORING AND CONTROLLING COMPOSITION DURING MOLECULAR BEAM EPITAXY

[75] Inventors: Thomas M. Brennan, Albuquerque; B. Eugene Hammons, Tijeras; Jeffrey Y. Tsao, Albuquerque, all of N. Mex.

[73] Assignee: The United States of America as represented by the United States Department of Energy, Washington, D.C.

[21] Appl. No.: 567,512

[22] Filed: Aug. 15, 1990

[51] Int. Cl.[5] .................................... C30B 25/16
[52] U.S. Cl. ............................... 156/601; 156/610; 156/611; 156/613; 437/81; 437/107; 437/108; 437/133
[58] Field of Search ........... 148/DIG. 6, 23, 56, 148/65, 169; 156/610-614, 601; 427/248.1, 258.1; 437/8, 81, 105, 107, 108, 110, 133, 936, 945

[56] References Cited

U.S. PATENT DOCUMENTS

| | | | |
|---|---|---|---|
| 3,654,109 | 4/1972 | Hohl et al. | 204/192 |
| 4,159,919 | 7/1979 | McFee et al. | 437/105 |
| 4,332,833 | 6/1982 | Aspnes et al. | 437/8 |
| 4,343,674 | 8/1982 | Dutt et al. | 437/8 |
| 4,456,879 | 6/1984 | Kleinknecht | 437/8 |
| 4,575,462 | 3/1986 | Dobson et al. | 437/107 |
| 4,668,530 | 5/1987 | Reif et al. | 437/8 |
| 4,777,146 | 10/1988 | Bylsma et al. | 437/8 |
| 4,786,616 | 11/1988 | Awal et al. | 437/105 |
| 4,843,029 | 6/1989 | Joyce et al. | 437/107 |
| 4,902,631 | 2/1990 | Downey et al. | 437/8 |

FOREIGN PATENT DOCUMENTS

| | | | |
|---|---|---|---|
| 0033079 | 3/1980 | Japan | 437/105 |
| 0186284 | 8/1986 | Japan | 437/107 |
| 0190920 | 8/1986 | Japan | 437/105 |
| 0256624 | 11/1986 | Japan | 437/107 |
| 0076318 | 4/1988 | Japan | 437/107 |

OTHER PUBLICATIONS

Parker *The Technology and Physics of Molecular Beam Epitaxy*, Plenum Press, New York, 1985, pp. 39-41.

Tsao et al., "Surface-Stoichiometry Dependence of $As_2$ Desorption and $As_4$ Reflection from GaAs(001)", *Journal Vacuum Science Technology* A, vol. 7, No. 3, May/Jun. 1989, pp. 2138-2142.

Tsao et al., "On-Line Determination of Alloy Composition During Ternary III/V Molecular Beam Epitaxy", *Applied Physics Letters*, vol. 55, No. 8, Aug. 21, 1989, pp. 777-779.

Brennan et al., "Application of Reflection Mass Spectrometry to Molecular-Beam Epitaxial Growth of InAlAs and InGaAs", *Journal Vacuum Science Technology* B, vol. 7, No. 2, Mar./Apr. 1989, pp. 277-282.

Tsao et al., "Reflection Mass Spectrometery of As Incorporation During GaAs Molecular Beam Epitaxy", *Applied Physics Letters*, vol. 53, No. 4 Jul. 25, 1988, pp. 288-290.

*Attorney, Agent, or Firm*—Karla Ojanen; James H. Chafin; William R. Moser

[57] ABSTRACT

A method for on-line accurate monitoring and precise control of molecular beam epitaxial growth of Groups III-III-V or Groups III-V-V layers in an advanced semiconductor device incorporates reflection mass spectrometry. The reflection mass spectrometry is responsive to intentional perturbations in molecular fluxes incident on a substrate by accurately measuring the molecular fluxes reflected from the substrate.

The reflected flux is extremely sensitive to the state of the growing surface and the measurements obtained enable control of newly forming surfaces that are dynamically changing as a result of growth.

18 Claims, 2 Drawing Sheets

(List continued on next page.)

*Primary Examiner*—Robert Kunemund

OTHER PUBLICATIONS

Foxon et al., "Evaluation of Surface Kinetic Data by the Transform Analysis of Modulated Molecular Beam Measurements", *Surface Science*, vol. 44, 1974, pp. 69–92.

Foxon et al., "Interaction Kinetics of $As_4$ and Ga On (100) GaAs Surfaces Using a Modulated Molecular Beam Technique", *Surface Science*, vol. 50, 1975, pp. 434–450.

Kemeny, "Summary Abstract: Composition of AlGaAs Films Grown By Molecular Beam Epitaxy", *Journal Vacuum Science Technology B*, vol. 4, No. 2, Mar./Apr. 1986, pp. 556–557.

SpringThorpe et al., "Mass Spectrometry During Molecular-Beam Epitaxy: An Alternative To Reflection High-Energy Electron Diffraction", *Journal Vacuum Science Technology B*, vol. 6, No. 2, Mar./Apr. 1988, pp. 754–756.

Evans, "Cation Incorporation Rate Limitations in Molecular-Beam Epitaxy: Effects of Strain and Surface Composition", *Journal Vacuum Science Technology B*, vol. 2, Mar./Apr. 1989, pp. 259–263.

Arthur, "Surface Stoichiometry and Structure of GaAs", *Surface Science*, vol. 43, 1974, pp. 449–461.

REFLECTION MASS SPECTROMETRY TECHNIQUE FOR MONITORING AND CONTROLLING COMPOSITION DURING MOLECULAR BEAM EPITAXY

The U.S. Government has rights in this invention pursuant to Contract No. DE-AC04-76DP00789 between the Department of Energy and American Telephone & Telegraph Company.

BACKGROUND OF THE INVENTION

This invention relates generally to the growth of semiconductor materials from which devices are fabricated and, more particularly, to a method of monitoring and controlling the deposition of crystalline films of Group III/V compound semiconductors by molecular beam epitaxy (MBE). Molecular beam epitaxy is a process in which atoms and molecules are evaporated onto crystalline substrates in ultra-high vacuum, i.e., $1 \times 10^{-9}$ torr background pressures. Because of the cleanliness of the environment, the resulting crystalline films are near-perfect and have outstanding optical and electrical properties. Appropriate shuttering of the atomic and molecular fluxes, moreover, enable combinations of different alloy compositions and thicknesses to be created and layered, from which optical and electronic devices may eventually be fabricated.

Among the most commonly deposited alloys grown by MBE are various combinations of Group III, e.g., Al, Ga or In, and Group V, e.g., P, As or Sb, elements. The thermodynamics of these alloys requires predominantly a one-to-one ratio between elements of the two groups, e.g., one molecule of Ga will covalently bond with one molecule of As. The surface chemistry of these alloys also stipulates that all incident Group III atoms nearly always "stick" to the growth surface, while incident Group V molecules only "stick" to the growth surface when Group III atoms have already "stuck" to the growth surface. Therefore, it is common practice to bathe the semiconductor substrate surface in a flux rich in Group V molecules because the excess Group V flux, beyond that required to form the stoichiometric (1:1) III-V compound, will simply reflect back from the growth surface. Note that for both Group III and Group V fluxes, it is important to distinguish between the incident flux of atoms or molecules actually incident on the growth surface and the incorporated flux which is that portion of the incident flux that actually "sticks" and incorporates into the growing crystal.

An important class of III/V material deposited by MBE through appropriate choices of incident atomic or molecular fluxes consists of III-III-V alloys in which more than one Group III element is present, e.g., $Al_xGa_{1-x}As$, or III-V-V alloys in which more than one Group V element is present, e.g., $InAs_xSb_{1-x}$. In these cases, by composition, "x", we do not mean the III/V ratio in either a III-III-V or a III-V-V crystal, which is always unity, but rather the III/III ratio in a III-III-V crystal, or the V/V ratio in a III-V-V crystal.

In such ternary alloys, the composition is an important determinant of device performance, and must be controlled accurately. Currently, it is common practice to calibrate the atomic or molecular fluxes before growth, and then to rely on those fluxes to remain stable during growth. Such stability is difficult to maintain especially during complex and extended growth sequences greater than, for example, four hours.

The only existing method for deducing III/III incorporation ratios, i.e., the composition of a III-III-V alloy, or for deducing V/V incorporation ratios, i.e., the composition of a III-V-V alloy, during growth is based on oscillations in reflection high-energy electron diffraction (RHEED) intensities. Such oscillations are known to be periodic with the atomic bilayer by bilayer growth cycle, where each bilayer is a sheet of Group III atoms and a sheet of Group V atoms. The intensity minima in the oscillations occur whenever half an atomic bilayer is completed, and the intensity maxima whenever a full atomic bilayer is completed. Therefore, the RHEED oscillation technique can measure absolute growth rates. Then, from measurements of the rate at which, for example, a III-III-V alloy grows and the rate at which one of the constituent III-V alloys grows (by shuttering off the other Group III source), the III/III incorporation ratio may be determined. The V/V ratio in a III-V-V alloy may be determined in a similar way.

RHEED oscillations, however, are observed only under fairly restrictive conditions. A further disadvantage is that RHEED oscillations can only be initiated on perfectly smooth surfaces, which typically are prepared by long, i.e., greater than five seconds, and undesirable growth interruptions. Monitoring absolute growth rates using RHEED oscillations, moreover, sometimes requires crystal growth at lower-than-optimal temperatures. The RHEED oscillations technique further requires that the substrate be immobilized during growth, which is inconsistent with the preferred and common practice of rotating the substrate during growth to increase lateral uniformity. Finally, measuring RHEED oscillations requires at least and generally much more than a full bilayer of sacrificial growth of one of the pure binary compounds.

Although the RHEED oscillations method is commonly used before growth as a method to calibrate the compositions expected during growth, it remains impractical because of the limitations discussed above and it is not universally useful for real-time determination of III-III-V or III-V-V alloy composition.

Mass spectrometric measurements of atomic or molecular fluxes "reflected" or "desorbed" from the growth surface are sometimes called Reflection Mass Spectrometry (REMS) measurements. REMS measurements usually make use of a cryo-shrouded mass spectrometer that measures mass-analyzed, line-of-sight chemical fluxes from a growing wafer. Previous work of Foxon and Joyce; Arthur; SpringThorpe and Mandeville; Evans, Stutz, Lorance and Jones have shown that REMS measurements provide much information about the growth surface itself. To put these previous studies of REMS measurements in context, they may be classified into one of two categories.

The first category includes the work of Brennan, Tsao, Klem, Hammons and Jones (1989); SpringThorpe and Mandeville; Evans, Stutz, Lorance and Jones and comprises measurements made of Group III fluxes reflected or desorbed from the growth surface. Although these measurements are interesting in their own right, the Group III fluxes leaving the surface are normally quite small. Moreover, the reflected flux of Group III is complexly dependent upon the incident and incorporation fluxes of all other species as well as on temperature. A simple measurement of Group III reflected fluxes, therefore, has not led nor is likely to lead to a technique for deducing the incorporation rate of Group III or Group V species during growth.

The second category of REMS measurements' studies includes the research of Tsao, Brennan and Hammons (1988); Tsao, Brennan, Klem and Hammons (1989); Foxon and Joyce; and Arthur and measure Group V fluxes reflected or desorbed from the growth surface. These reflected Group V fluxes are also an indirect measure of the incident Group III fluxes for the following reason. Under ordinary growth conditions for which the incident Group V flux is greater than the incident Group III flux, every incident Group III atom consumes exactly one Group V atom and decreases the reflected Group V flux by one atom. Therefore, the lower the measured reflected Group V flux, the higher must be the incident Group III flux. Likewise, the higher the incident Group III flux, the lower the measured reflected Group V flux. In principle, from this "inverse" one-to-one relation between the incident Group III flux and the reflected Group V flux it should be possible to absolutely determine the incident Group III flux. But an absolute measurement of the incident Group III flux requires that the absolute incident Group V flux be already known from a previous measurement. In practice, Group V fluxes not only are difficult to calibrate exactly, but the flux actually drifts during long growth runs. Moreover, Group V species are not pumped effectively by the liquid-nitrogen-cooled cryoshrouds in the chamber. Thus as the crystal is grown, the Group V species create a "background" pressure. This background pressure further complicates the inverse one-to-one relation between the incident Group III flux and the reflected Group V flux. Thus, this method of measuring Group V reflected flux has not resulted in a reliable and stable technique for deducing the Group III or Group V fluxes actually incident on the growth surface.

SUMMARY OF THE INVENTION

Techniques for deducing composition during growth, therefore, are exceedingly important, because these techniques would permit on-line feedback control of the fluxes. The Reflection Mass Spectrometry monitor can be applied in virtually any molecular beam epitaxy system. It is an improvement over existing technology in that it allows direct control of surface composition during growth. No other comparable technique exists today. In view of the prior art and its limitations, it is the object of this invention to provide a novel technique to deduce, with minimal perturbation of the growth process itself, the surface composition of III-III-V and III-V-V alloys during growth. Other objects, features and advantages of the invention will become apparent to those skilled in the art upon reading the following description.

This object has been attained using a reflection mass spectrometry (REMS) technique, in which the responses of the "reflected" flux of one of the volatile Group V species are measured during momentary terminations of one or both of the Group III or Group V fluxes. The technique requires no special surface preparation, perturbs the growth process itself minimally, is compatible with wafer rotation, works over a wide range of growth temperatures, automatically compensates for non-unity sticking of Group III fluxes (e.g., during high temperature epitaxy), and is easily generalized to an arbitrary number of Group III or Group V fluxes.

DESCRIPTION OF THE PREFERRED EMBODIMENT

Figure 1:
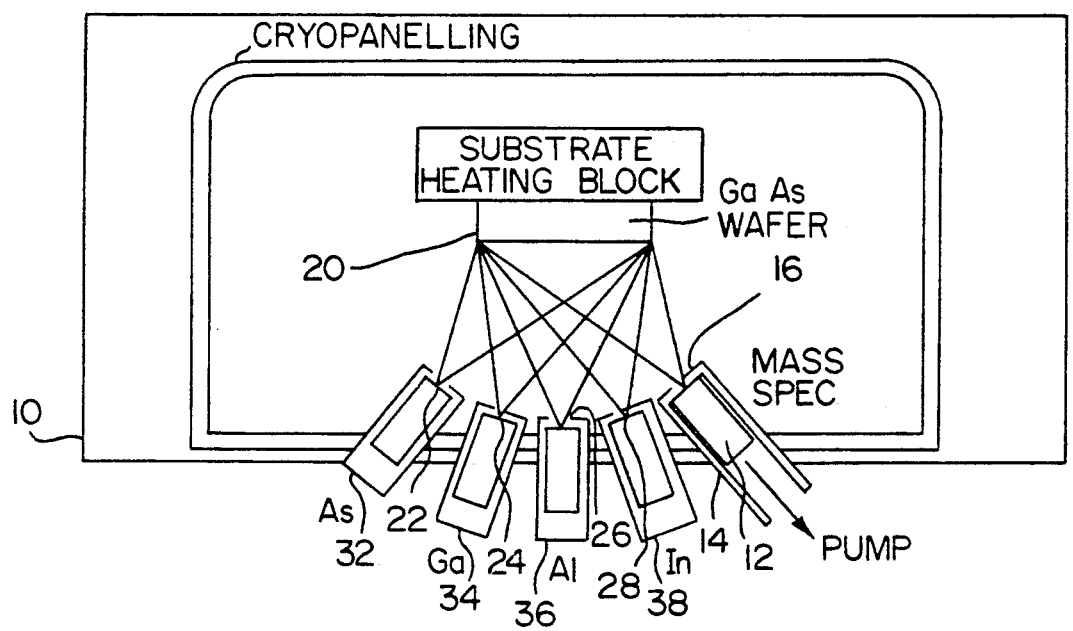
FIG. 1 is a schematic of the apparati arrangement wherein a mass spectrometer is incorporated into a typical molecular beam epitaxial chamber, and this arrangement permits the method of the invention.

The invention disclosed herein takes advantage of the insight that Reflection Mass Spectrometry (REMS) measurements are able to determine relative fluxes extremely accurately, even though REMS is unable to determine absolute fluxes accurately. The REMS measurements of relative fluxes ar sufficient to determine surface alloy composition in a growing semiconductor crystal of either III-III-V or III-V-V arrangement.

The invention takes advantage of the fact that Type III-V crystals always grow in a one-to-one relationship, and the observation that a Group V constituent such as arsenic will stick to the substrate only if there is at least one Group III element, such as aluminum or gallium, available for binding. Therefore, arsenic will bind only in a one-to-one stoichiometric relationship with either gallium or aluminum, and arsenic will further only contribute to the epitaxial layer growth in the presence of gallium or aluminum. This behavior is exhibited by other Type V elements. The reflection mass spectrometry technique described herein is applicable to the growth of semiconductor epitaxial layers of other groups of the Periodic Chart providing that certain criteria are satisfied: first, two of the species incorporated into the epitaxial layer should be from different Groups of the Periodic Table; second, that these two species react in a predominantly one-to-one stoichiometric ratio; and that at least one of the species reflects from the surface of the substrate during the growth.

In particular, the measurement of the relative amount of a species of Group III that is incorporating into the growing crystal can be made by observing the response of one of the Group V reflected fluxes to the absence of a Group III species. The momentary, absence of the Group III species on the surface of the substrate will cause the reflected Group V flux to increase. The reason is that Group III species consume Group V species; therefore, in the absence, even a momentary absence as discussed below, of a Group III species, there is an increase in the Group V species reflected from the surface. The amount by which the reflected Group V flux increases is a relative measure of the incorporation rate of the Group III species into an epitaxial layer onto the semiconductor substrate. When the absence of the Group III species is momentary as when an effusion cell shutter of a molecular beam epitaxy (MBE) chamber is closed for a brief interval, then it is more accurate to use the integral of the increase in the Group V flux during that interval as a relative measure of the incorporation rate of Group III species.

Now if the species that momentarily disappears is a Group V species, then closing and re-opening a Group V cell effusion shutter of a MBE chamber will instead cause the reflected flux of any other Group V species present to decrease and then increase momentarily. The reason is that Group V species compete with each other to bind with Group III species and assuming the incident flux of the Group III species is constant, the momentary absence of one of the Group V species must lead to greater incorporation of a second Group V species, hence a decrease in the second Group V flux reflected from the surface is observed. The amount by which the reflected flux of the second Group V species decreases is then a relative measure of the incorporation rate of the first Group V species. Likewise, if the shutter is only closed for a brief interval, then a more accurate measure of the relative incorporation rate of the Group V species is the integral of the decrease in the Group V flux during that interval. Finally, the ratio of two such relative measurements made in sequence determines the actual composition of the growing crystal.

As shown in FIG. 1, the configuration to allow for the monitor and control process is a reflection mass spectrometer (REMS) 12 that has been incorporated into a molecular beam epitaxy (MBE) chamber 10. This arrangement of the apparati takes advantage of the improved control over surface preparation and growth environments that state-of-the-art chambers present. The mass spectrometer 12 is carefully recessed in a liquid nitrogen cooled housing 14. This cryoshrouding, together with the extensive cryoshrouding already present in the main MBE chamber 10 permits good discrimination of the chemical species present against the background of volatile Group V species without the use of cumbersome modulated beam techniques. If the spectrometer 12 is not apertured, except for the 1.4 inch diameter port shutter 16, and if the mass resolution is adjusted to be somewhat greater than two amu, the signal to noise ratio can be increased by more than an order of magnitude. The MBE 10 is pumped to a vacuum of $10^{-10}$ torr and during the growth process the pressure is maintained at approximately $10^{-6}$ torr.

Within the MBE chamber 10, the wafer 20 is mounted and heated to a temperature in a range from 400–700 degrees C., depending on the substrate and desired crystal growth. Optimum temperature is typically 500–600 degrees C. Located approximately eight inches from the wafer 20 is a number of effusion ports 22, 24, 26, 28 for location of effusion cells 32, 34, 36, 38 containing compounds to be effused onto the semiconductor substrate. For instance, for a growth process to include layers of aluminum, gallium and arsenic, each of three effusion cells will contain one of the constituents of the alloy comprising the layer.

Molecular beam epitaxy is done in an overpressure condition of arsenic, i.e., the arsenic or any other Type V compound will be effused at a flux of approximately twice the flux necessary for binding and building the epitaxial layer. Therefore, when arsenic reflects back from the surface, not all of the arsenic is binding with the Type III to form an epitaxial layer. The method described herein measures the relative amounts of Type V compounds to Type V compounds, but equally important, also measure the relative ratios of Type III to Type III compounds.

Figure 2:
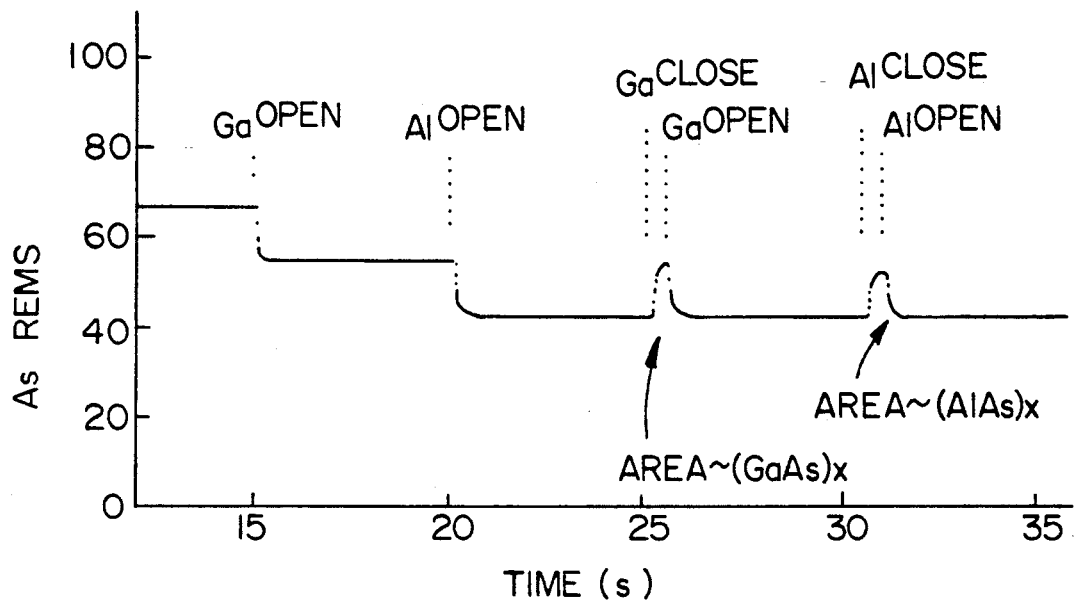
FIG. 2 is a graph representing the method of the invention wherein the reflection mass spectroscopy signals of a Type V element exhibits binding with Type III elements coincident with shuttering of effusion cells during growth of a III-III-V epitaxial layer.

FIG. 2 illustrates the first example of method of the invention. Consider the growth of $Al_xGa_{1-x}As$ crystal. During the epitaxial growth process of the inventive method herein, initially, only the shutters to the $As_4$ effusion cell and quadrupole mass spectrometer are open. In the absence of a coincident Ga flux, there is no net As incorporation, so the reflected As flux from the surface is relatively high. At t=5 seconds and t=10 seconds, the shutter to the quadrupole mass spectrometer is closed and then reopened, respectively. During this period, the mass spectrometer signal As signal is small but nonzero, principally due to volatile $As_4$ which has collected in the imperfectly cryoshrouded mass spectrometer.

A t=15 seconds, the Ga shutter of the Ga effusion cell is opened, and growth of the GaAs binary alloy commences. Since some of the incident $As_4$ flux must now incorporate into the growing GaAs, less is reflected, and the mass spectrometer As signal decreases. At t=20 seconds, the Al shutter of the Al effusion shutter is opened and growth of the $Al_xGa_{1-x}As$ ternary complex commences. Since even more of the incident $As_4$ flux must now incorporate into the growing $Al_xGa_{1-x}As$ layer, even less As is reflected, and the mass spectrometer As signal decreases further.

The technique described further permits a determination of the composition of the growing $Al_xGa_{1-x}As$ layers. Since the overall III/V stoichiometry is unity, the As incorporation rate must equal the sum of the Group III incorporation rates. If one of the Group III fluxes is momentarily terminated, then the excess As that does not incorporate must equal the "missing" Group III flux that would have incorporated. Therefore, the ratio between the total excess reflected As during momentary terminations of each of the Group III fluxes is the ratio between the respective Group III incorporation rates. Those skilled in the art will appreciate that this method measures the ratio between Group III incorporation rates, not arrival fluxes. Under most growth conditions, these ratios will be the same, however, under conditions for which Group III incorporation coefficients are less than unity, e.g., during high-temperature growth, these ratios differ.

A sequence of momentary shutter closings and openings is shown at t=25 seconds for the Ga shutter and at t=30.5 seconds for the Al shutter. In each case, the shutters were closed for 0.5 seconds, during which time approximately half a bilayer of either pure AlAs or pure GaAs is grown. These shutter closing durations were chosen for demonstration purposes only. In practice, shorter durations or slower growth rates can be used if it is important to avoid sacrificial growth of even half a bilayer of binary alloy. We have found our results to be essentially unchanged for shutter durations as short as 0.2 seconds, approaching the ~0.12 second time resolution of the shutters themselves. It is not important to time-resolve the rise and fall of the excess As signals during the momentary shutter closings and openings, since only the integral of the excess As flux matters.

As shown, the mass spectrometer As signal increases momentarily while each of the Group III shutters is closed. Denoting the integrals of those momentary excess mass spectrometry As signals to be $Y_{Ga}$ and $Y_{Al}$, and noting that the signal is nearly exactly proportional to the total As flux leaving the surface, the Al mole fraction is simply $x_{REMS} = Y_{Al}/(Y_{Ga}+Y_{Al})$. In other words, the ratio between the integrals of the "excess" REMS signals during these shutter closings is the Ga to Al ratio in the growing film itself.

Figure 3:
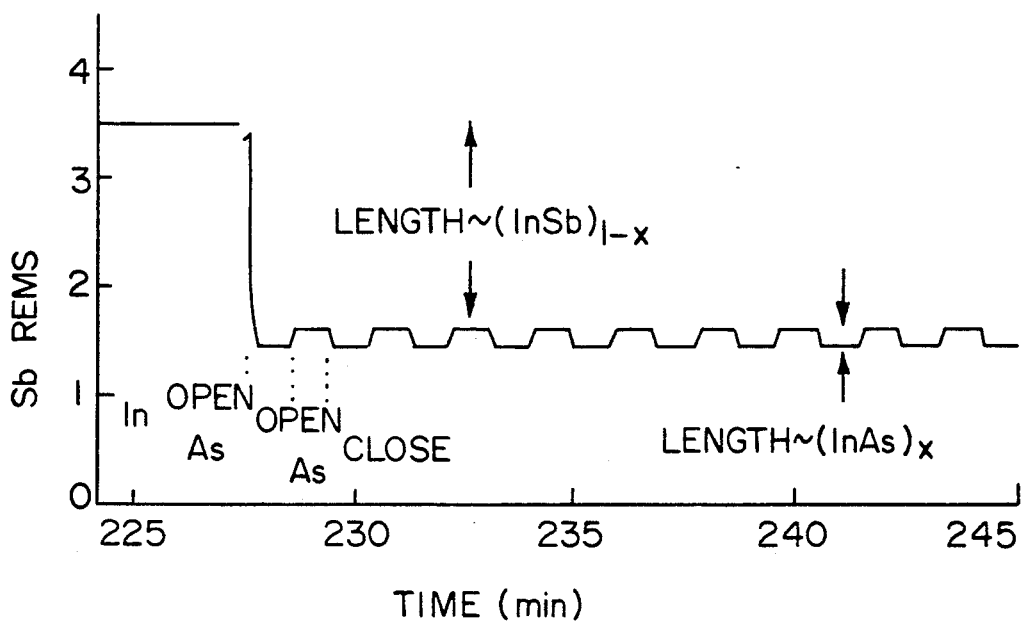
FIG. 3 is a graph representing the method of the invention wherein the reflection mass spectroscopy signals of a Type V element exhibits binding with a Type III element coincident with shuttering of effusion cells during growth of a III-V-V epitaxial layer.

Likewise, the technique can be used to monitor and control the relative amounts of Group III-V-V ternary semiconductor compositions, the growth of $InAs_xSb_{1-x}$, as the second example of the method of the invention. FIG. 3 illustrates the mass spectrometer measurements of Sb during $InAs_{1-x}Sb_x$ molecular beam epitaxy. Initially, the In and As shutters are closed, so that all the Sb that strikes the surfaces reflects back and is measured by the mass spectrometer. At t=227.5 seconds, the In shutter is opened, some of the Sb striking the surface incorporates into the growing InSb crystal, and the reflected mass spectrometer Sb signal decreases. At 1.8 second intervals after that, the As shutter opens for 0.9 seconds for growth of an InSb-/$InAs_{1-x}Sb_x$ superlattice. The incident As displaces some of the Sb that would otherwise have incorporated, resulting in an increase of the mass spectrometer Sb signal. The ratio between the amount by which the As displaces the Sb to the amount of Sb consumed by the In itself, is the As to Sb ratio in the growing film itself.

The method automatically compensates for non-unity incorporation coefficients (e.g., during high temperature epitaxy), and is easily generalized to an arbitrary number of Group III or Group V fluxes.

Specifically, the method of this invention allows for control of the III/III ratios of a III-III-V compound or the control of the V/V ratios of a III-V-V compound by manual or computer control of the incident flux of any of the compounds of interest. Such control of flux is achieved through adjustment of the effusion cells containing the constituents to be incorporated into the epitaxial layer. Such accurate and responsive control of the growth permit smaller variances of the III/III ratios or the V/V ratios per individual layers of a semiconductor device.

Though the invention has been described with respect to a specific preferred embodiment thereof, many variations and modifications will immediately become apparent to those skilled in the art. For example, as more sophisticated and complex compounds are determined to be useful in epitaxial growth, the method described herein can be easily modified to accomodate the varying masses of the compounds. Control of the epitaxial layers is ultimately dependent upon the absolute concentration of the constituents, which, at the present time, is determined by the rate of flux of the elements from the effusion cells. It is envisioned that control of the effusion flux be controlled by a computer. The method described herein allows that the predetermined structure of epitaxial layers, wherein the composition of each layer varies, can be preprogrammed into a computer-controlled REMS/MBE chamber incorporating the method described herein. It is therefore the intention that the appended claims be interpreted as broadly as possible in view of the prior art to include all such variations and modifications.

We claim:

1. A method for growing epitaxial layers of semiconductor devices, comprising the steps of:
    (a) installing a cryoshrouded reflection mass spectrometer into a molecular beam epitaxial chamber;
    (b) establishing a vacuum within the chamber;
    (c) heating a substrate within the chamber to a temperature suitable for epitaxial growth;
    (d) establishing an incident molecular flux of a first species directed towards the substrate, said first species incorporated into the growth of the epitaxial layer;
    (e) measuring the reflected flux from the substrate of said first species using the mass spectrometer to obtain a first measurement of the reflected flux of said first species;
    (f) establishing an incident molecular flux of a second species directed towards the substrate, said first species belonging to a different Group from said second species, and wherein at least one of said species reflects from the substrate, said first species and said second species incorporated in a predominantly one-to-one stoichiometric relationship as a binary compound into the growth of the epitaxial layer;
    (g) establishing an incident molecular flux of a third species directed towards the substrate, said first, second an third species incorporated as a ternary compound into the growth of the epitaxial layer;
    (h) momentarily interrupting the molecular flux of the second species and measuring the reflected flux from the substrate of said first species using the mass spectrometer to obtain a second measurement of the reflected flux of said first species;
    (i) reestablishing the incident molecular flux of the second species;
    (j) momentarily interrupting the molecular flux of the third species and measuring the reflected flux from the substrate of said first species using the mass spectrometer to obtain a third measurement of the reflected flux of said first species;
    (k) comparing the mass spectrometer signal from step (h) relative to the mass spectrometer signal obtained form step (j) to determine the relative ratios of two of said species incorporated into the substrate during the growth of the epitaxial layer.

2. The method of claim 1, wherein said first species is a Group V element.

3. The method of claim 2, wherein said second species is a Group III element.

4. The method of claim 3, wherein said third species is a Group III compound.

5. The method of claim 3, wherein said third species is a Group V compound.

6. The method of claim 1, wherein said steps of measuring the reflected flux of said first species further comprises measuring the integral of a reflection mass spectrometry signal.

7. The method of claim 6, wherein the ratio of the measurements obtained from said steps of momentarily interrupting the incident molecular flux of the second species and measuring the reflected flux from the substrate of the first species using the mass spectrometer and momentarily interrupting the incident molecular flux of the third species and measuring the reflected flux from the substrate of the first species using the mass spectrometer determines ratios of the second and third species incorporated into the substrate during the growth of the epitaxial layer.

8. The method of claim 6, wherein the ratio of the measurements obtained from said steps of momentarily interrupting the incident molecular flux of the second species and measuring the reflected flux from the substrate of said first species using the mass spectrometer and momentarily interrupting the incident molecular flux of the third species and measuring the reflected flux from the substrate of said first species using the mass spectrometer determines ratios of the first and second species incorporated into the substrate during the growth of the epitaxial layer.

9. The method of claim 7, further comprising adjusting the incident molecular flux of the second species responsive to the ratios of the second species to the third species.

10. The method of claim 7, further comprising adjusting the incident molecular flux of the third species responsive tot he ratio of the second species to the third species.

11. The method of claim 8, further comprising adjusting the incident molecular flux of the second species responsive to the ratio of the first species to the third species.

12. The method of claim 8 further comprising adjusting the incident molecular flux from said effusion cells of said third species responsive to the ratio of the first species to the third species.

13. The method of claim 1, wherein the ratio of the measurement from the first measurement of the reflected flux of said first species to the measurement of the second measurement of the reflected flux of said first species determines a ratio of the first species to the second species.

14. The method of claim 1, wherein the ratio of the measurement from the second measurement of the reflected flux of said first species to the measurement of the third measurement of the reflected flux of said first species determines a ratio of the second species to the third species.

15. A method for growing epitaxial layers of semiconductor devices, comprising the steps of:
 (a) installing a cryoshrouded reflection mass spectrometer into a molecular beam epitaxial chamber;
 (b) establishing a vacuum within the chamber;
 (c) heating s substrate within the chamber to a temperature suitable for epitaxial growth;
 (d) establishing an incident molecular flux of a first Group V semiconductor species directed towards the substrate, said first species incorporated into the growth of the epitaxial layer;
 (e) measuring the reflected flux from the substrate of said first Group V semiconductor species using the mass spectrometer to obtain a first measurement of the reflected flux of said first species;
 (f) establishing an incident molecular flux of a first Group III semiconductor species directed towards the substrate, the first Group V species and the first Group III species incorporated in a predominantly one-to-one stoichiometric relationship as a binary compound into the growth of the epitaxial layer;
 (g) establishing an incident molecular flux of a second group III semiconductor species directed towards the substrate, the first Group V, the first Group III and the second Group III speices incorporated as a ternary compound into the growth of the epitaxial layer;
 (h) momentarily interrupting from 0.1 to 0.5 seconds, the molecular flux of the first Group III species and measuring the reflected flux from the substrate of the first Group V species using the mass spectrometer to obtain a second measurement of the reflected flux of said first Group V species;
 (i) reestablishing the incident molecular flux of the first Group III species;
 (j) momentarily interrupting from 0.1 to 0.5 seconds, the molecular flux of the second Group III species and measuring the reflected flux form the substrate of the first Group V species using the mass spectrometer to obtain a third measurement of the reflected flux of said first Group V species;
 (k) comparing the mass spectrometer signal from step (h) relative to the mass spectrometer signal obtained from step (j) to determine the relative ratios of the first Group III semiconductor species to the second Group III semiconductor species incorporated into the substrate during the growth of the epitaxial layer.

16. The method of claim 15, further comprising adjusting the incident molecular flux of either said first or said second Group III semiconductor species to achieve the desired ratio of said first Group III semiconductor species to said second Group III semiconductor species.

17. A method for growing epitaxial layers of semiconductor devices, comprising the steps of:
 (a) installing a cryoshrouded reflection mass spectrometer into a molecular beam epitaxial chamber;
 (b) establishing a vacuum within the chamber;
 (c) heating a substrate within the chamber to a temperature suitable for epitaxial growth;
 (d) establishing an incident molecular flux of a first Group V semiconductor species directed towards the substrate, said first species incorporated into the growth of the epitaxial layer;
 (e) measuring the reflected flux from the substrate of said first Group V semiconductor species using the mass spectrometer to obtain a first measurement of the reflected flux of said first species;
 (f) establishing an incident molecular flux of a first Group III semiconductor species directed towards the substrate, the first Group V species and the first Group III species incorporated in a predominantly one-to-one stoichiometric relationship as a binary compound into the growth of the epitaxial layer;
 (g) establishing an incident molecular flux of a second Group V semiconductor species directed towards the substrate, the first Group V semiconductor species, the first Group III semiconductor species and the second Group V semiconductor species incorporated as a ternary compound into the growth of the epitaxial layer;
 (h) momentarily interrupting from 0.1 to 0.5 seconds, the molecular flux of the first Group III species and measuring the reflected flux from the substrate of the first Group V species suing the mass spectrometer to obtain a second measurement of the reflected flux of said first species;
 (i) reestablishing the incident molecular flux of the first Group III species;
 (j) momentarily interrupting form 0.1 to 0.5 seconds, the molecular flux of the second Group V species measuring the reflected flux from the substrate of the first Group V species using the mass spectrometer to obtain a third measurement of the reflected flux of said first species;
 (k) comparing the mass spectrometer signal from step (h) relative to the mass spectrometer signal obtained from stp (j) to determine the relative ratios of the first Group V semiconductor species to the second Group V semiconductor species incorporated into the substrate during the growth of the epitaxial layer.

18. The method of claim 17, further comprising adjusting the incident molecular flux of either said first or second Group V semiconductor species to achieve the desired ratio of said first Group V semiconductor species to said second Group V semiconductor species.

* * * * *